United States Patent
Li

(10) Patent No.: US 10,355,210 B2
(45) Date of Patent: Jul. 16, 2019

(54) MANUFACTURING METHOD OF OLED SUBSTRATE AND MANUFACTURING METHOD OF OLED DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Songshan Li, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/576,864

(22) PCT Filed: Nov. 16, 2017

(86) PCT No.: PCT/CN2017/111262
§ 371 (c)(1),
(2) Date: Nov. 27, 2017

(65) Prior Publication Data
US 2019/0131530 A1 May 2, 2019

(30) Foreign Application Priority Data

Oct. 30, 2017 (CN) .......................... 2017 1 1035471

(51) Int. Cl.
*H01L 51/00* (2006.01)
*H01L 27/32* (2006.01)
(Continued)

(52) U.S. Cl.
CPC ...... *H01L 51/0021* (2013.01); *H01L 27/3246* (2013.01); *H01L 51/5012* (2013.01);
(Continued)

(58) Field of Classification Search
CPC ............. H01L 51/0021; H01L 51/5215; H01L 51/5012; H01L 27/3246
See application file for complete search history.

(56) References Cited

U.S. PATENT DOCUMENTS 8,890,129 B2 * 11/2014 Nishiyama .......... H01L 51/5215
257/40
8,963,415 B2 * 2/2015 Sugano ............... H01L 51/5203
257/40
(Continued)

FOREIGN PATENT DOCUMENTS

CN 103594661 A 2/2014
CN 106848102 A 6/2017

*Primary Examiner* — William Coleman
(74) *Attorney, Agent, or Firm* — JMB Davis Ben-David

(57) ABSTRACT

A manufacturing method of an OLED substrate and a manufacturing method of an OLED device are provided. The manufacturing method of the OLED substrate include steps of providing a base substrate; sequentially forming a first metal layer, a second metal layer, and a third metal layer on the base substrate; forming a pixel definition layer on the second metal layer; and forming a light-emitting layer on the third metal layer. The default water flow rate of the first metal layer and the third metal layer are different from each other.

14 Claims, 3 Drawing Sheets

(51) Int. Cl.
*H01L 51/50* (2006.01)
*H01L 51/56* (2006.01)
*H01L 51/52* (2006.01)

(52) U.S. Cl.
CPC .......... *H01L 51/5215* (2013.01); *H01L 51/56* (2013.01); *H01L 2227/323* (2013.01); *H01L 2251/301* (2013.01); *H01L 2251/308* (2013.01)

(56) References Cited

U.S. PATENT DOCUMENTS

| | | | |
|---|---|---|---|
| 9,515,289 B2* | 12/2016 | Kamiya | H01L 51/56 |
| 9,553,156 B2* | 1/2017 | Kim | H01L 51/5228 |
| 9,947,429 B2* | 4/2018 | Shida | H01L 23/53247 |
| 2007/0096614 A1* | 5/2007 | Shin | H01L 51/5218 |
| | | | 313/112 |
| 2012/0091459 A1 | 4/2012 | Choi et al. | |
| 2016/0133675 A1* | 5/2016 | Yata | H01L 27/3218 |
| | | | 257/89 |
| 2016/0220422 A1* | 8/2016 | Schneider | A61F 13/15804 |
| 2016/0293895 A1* | 10/2016 | Kim | H01L 51/5281 |
| 2017/0141176 A1 | 5/2017 | Im et al. | |
| 2017/0221923 A1* | 8/2017 | Kanda | H01L 51/5218 |
| 2018/0269421 A1 | 9/2018 | Pan | |

* cited by examiner

MANUFACTURING METHOD OF OLED SUBSTRATE AND MANUFACTURING METHOD OF OLED DISPLAY DEVICE

CROSS REFERENCE TO RELATED APPLICATIONS

This application is a U.S. National Phase application submitted under 35 U.S.C. § 371 of Patent Cooperation Treaty Application serial No. PCT/CN2017/111262, filed on Nov. 16, 2017, which claims the priority of China Patent Application serial No. 201711035471.6, filed on Oct. 30, 2017, the disclosures of which are incorporated herein by reference in their entirety.

FIELD OF INVENTION

The present invention relates to the field of display technologies, and more particularly to a manufacturing method of an OLED substrate and a manufacturing method of an OLED display device.

BACKGROUND OF INVENTION

Organic light emitting diode (OLED) units are organic thin film electroluminescent devices, where OLED display panels possess many outstanding properties such as a simple preparation process, low cost, high electroluminescent efficiency, amenability to forming flexible structures, wide view angles, etc. Therefore, display technologies that use organic light-emitting diodes have become important display technologies.

Compared with thin film transistor-liquid crystal display (TFT-LCD) of existing flat panel display technologies, active-matrix organic light emitting diodes (AMOLED) possess many outstanding properties such as a high contrast ratio, wide view angles, low power consumption, lighter in weight, thinner, etc. AMOLEDs are expected to be next-generation flat panel display technology after LCDs, and AMOLEDs are one of the most anticipated technologies among current flat panel display technologies.

As shown in FIG. 1, during manufacture of back anodes 11 of conventional top-emitting AMOLEDs, structures of the top metal layers 113/silvers 112/bottom metal layers 111 are employed. The silver 112 is used for forming a transmitting layer. The top metal layer 113 and the bottom metal layer 111 employ the same film-forming parameters in the physical vapor-phase film forming processes. The etching process of the anode 11 is divided into three processes: etching of a top electrode, etching of a silver, and etching of a bottom metal layer when performing wet etching on the anodes 11. Because the top metal layer 113 is etched again during the etching of the bottom metal layer, it causes a huge loss of the top metal layer 113. It leads to the deposit of organic light-emitting materials 12 of OLEDs, which is deposited via vapor deposition afterwards, falls on the top of the silver 112 and influences light emitting of the OLEDs.

SUMMARY OF INVENTION

A manufacturing method of an OLED substrate and a manufacturing method of an OLED display are provided in the present disclosure to solve the problems of the huge loss of the top metal layer to the OLED back anode, which is too large and leads to the deposit of organic light-emitting materials falling on the top of the silver and influences the light emission of the OLEDs.

In order to achieve the above objects, a technical scheme is provided by the disclosure as follows:

according to one aspect of present disclosure, a manufacturing method of an OLED substrate is provided, the manufacturing method comprising:

a step S10 of providing a base substrate;

a step S20 of forming an anode layer on the base substrate, wherein the anode layer comprises a first metal layer, a second metal layer, and a third metal layer stacked in sequence;

a step S30 of forming a pixel definition layer on a surface of the second metal layer, wherein the pixel definition layer is made of polyimide, the pixel definition layer comprises at least two pixel definition bodies, and the third metal layer is positioned between the adjacent pixel definition bodies; and a step S40 of forming a light-emitting layer on a surface of the third metal layer, wherein the light-emitting layer is only disposed on the third metal layer, and the light-emitting layer is positioned between the adjacent pixel definition bodies;

wherein film-forming conditions of the first metal layer, the second metal layer, and the third metal layer are different from each other.

In a preferred embodiment of the present disclosure, the step S20 of forming the anode layer on the base substrate comprises:

a step S201 of depositing the first metal layer under a default cooling water flow rate condition of 4-6 standard mL/min;

a step S202 of forming the second metal layer on a surface of the first metal layer via vapor deposition;

a step S203 of depositing the third metal layer on the surface of the second metal layer under a default cooling water flow rate condition of 1-2 standard mL/min; and a step S204 of sequentially etching the third metal layer, the second metal layer and the first metal layer to obtain the anode layer.

In a preferred embodiment of the present disclosure, the base substrate is a thin film transistor substrate.

In a preferred embodiment of the present disclosure, the first metal layer and the third metal layer are indium tin oxide (ITO), and the second metal layer is silver.

In a preferred embodiment of the present disclosure, the third metal layer, the second metal layer, and the first metal layer are sequentially etched by wet etching.

In a preferred embodiment of the present disclosure, a physical vapor deposition is employed to perform film-forming processes on the first metal layer and the third metal layer.

According to another aspect of the present disclosure, a manufacturing method of an OLED display device is provided, the manufacturing method comprising:

a step S10 of providing a base substrate;

a step S20 of forming an anode layer on the base substrate, wherein the anode layer comprises a first metal layer, a second metal layer, and a third metal layer stacked in sequence;

a step S30 of forming a pixel definition layer on a surface of the second metal layer, wherein the pixel definition layer comprises at least two pixel definition bodies, and the third metal layer is positioned between the adjacent pixel definition bodies;

a step S40 of forming a light-emitting layer on a surface of the third metal layer, wherein the light-emitting layer is only disposed on the third metal layer, and the light-emitting layer is positioned between the adjacent pixel definition bodies;

a step S50 of coating a cathode on a surface of the light-emitting layer; and a step S60 of forming an encapsulation thin film layer on the surface of the cathode;

wherein film-forming conditions of the first metal layer, the second metal layer, and the third metal layer are different from each other.

In a preferred embodiment of the present disclosure, the step S20 of forming the anode layer on the base substrate comprises:

a step S201 of depositing the first metal layer under a default cooling water flow rate condition of 4-6 standard mL/min;

a step S202 of forming the second metal layer on a surface of the first metal layer via vapor deposition;

a step S203 of depositing the third metal layer on the surface of the second metal layer under a default cooling water flow rate condition of 1-2 standard mL/min; and a step S204 of sequentially etching the third metal layer, the second metal layer, and the first metal layer to obtain the anode layer.

In a preferred embodiment of the present disclosure, the first metal layer and the third metal layer are indium tin oxide (ITO), and the second metal layer is silver.

In a preferred embodiment of the present disclosure, the third metal layer, the second metal layer, and the first metal layer are sequentially etched by wet etching.

In a preferred embodiment of the present disclosure, a physical vapor deposition is employed to perform film-forming processes on the first metal layer and the third metal layer.

According to one more aspect of the present disclosure, a manufacturing method of an OLED substrate is provided, the manufacturing comprising:

a step S10 of providing a base substrate;

a step S20 of forming an anode layer on the base substrate, wherein the anode layer comprises a first metal layer, a second metal layer, and a third metal layer stacked in sequence;

a step S30 of forming a pixel definition layer on a surface of the second metal layer, wherein the pixel definition layer comprises at least two pixel definition bodies, and the third metal layer is positioned between the adjacent pixel definition bodies; and a step S40 of forming a light-emitting layer on a surface of the third metal layer, wherein the light-emitting layer is only disposed on the third metal layer, and the light-emitting layer is positioned between the adjacent pixel definition bodies;

wherein film-forming conditions of the first metal layer, the second metal layer, and the third metal layer are different from each other.

In a preferred embodiment of the present disclosure, the step S20 of forming the anode layer on the base substrate comprises:

a step S201 of depositing the first metal layer under a default cooling water flow rate condition of 4-6 standard mL/min;

a step S202 of forming the second metal layer on a surface of the first metal layer via vapor deposition;

a step S203 of depositing the third metal layer on the surface of the second metal layer under a default cooling water flow rate condition of 1-2 standard mL/min; and a step S204 of sequentially etching the third metal layer, the second metal layer, and the first metal layer to obtain the anode layer.

In a preferred embodiment of the present disclosure, the base substrate is thin film transistor substrate.

In a preferred embodiment of the present disclosure, the first metal layer and the third metal layer are indium tin oxide (ITO), and the second metal layer is silver.

In a preferred embodiment of the present disclosure, the third metal layer, the second metal layer, and the first metal layer are sequentially etched by wet etching.

In a preferred embodiment of the present disclosure, a physical vapor deposition is employed to perform film-forming processes on the first metal layer and the third metal layer.

The present disclosure provides a manufacturing method of an OLED substrate and a manufacturing method of an OLED display device. By changing the film-forming conditions of the first metal layer and the third metal layer in the anode, the etching loss of the third metal layer is reduced so that all the vapor evaporated OLED organic light-emitting materials fall on the third metal layer, which greatly improves the light-emitting characteristics of OLEDs.

DESCRIPTION OF DRAWINGS

In order to illustrate the technical solutions in the embodiments or in the prior art more clearly, the accompanying drawings required for the description of the embodiments or the prior art are introduced briefly hereafter. It is obvious that the accompanying drawings in the following description are merely part of the embodiments of the present disclosure. People with ordinary skills in the art can obtain other drawings without making inventive efforts.

DETAILED DESCRIPTION OF PREFERRED EMBODIMENTS

In the following detailed description, reference is made to the accompanying figures, in which various examples are shown by way of illustration. In this regard, directional terminology mentioned in the present disclosure, such as "top", "bottom", "front", "back", "left", "right", "vertical", etc., is used with reference to the orientation of the figures being described. Therefore, the directional terminology is used for purposes of illustration and is in no way limiting. In the appending figures, units with similar structures are indicated by the same reference numbers.

The present disclosure concerns existing OLED substrates and LED display device technology. Due to huge etching loss of the top metal layer 113 of a base anode, organic light-emitting materials are directly deposited on top of the silver and influences light emitting of the OLEDs. Therefore, a manufacturing method of an OLED substrate and a manufacturing method of an OLED display device are provided in order to improve defects.

The present disclosure is further described below with reference to the accompanying drawings and the specific embodiments.

Figure 1:
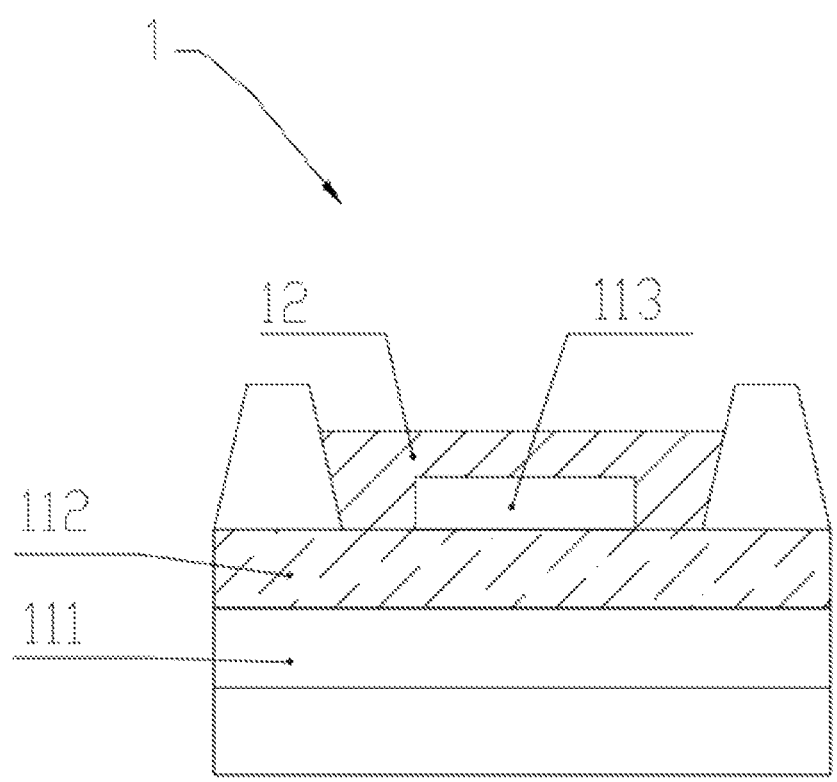
FIG. 1 is a schematic view of a structure of an OLED substrate in the prior art.
Figure 2:
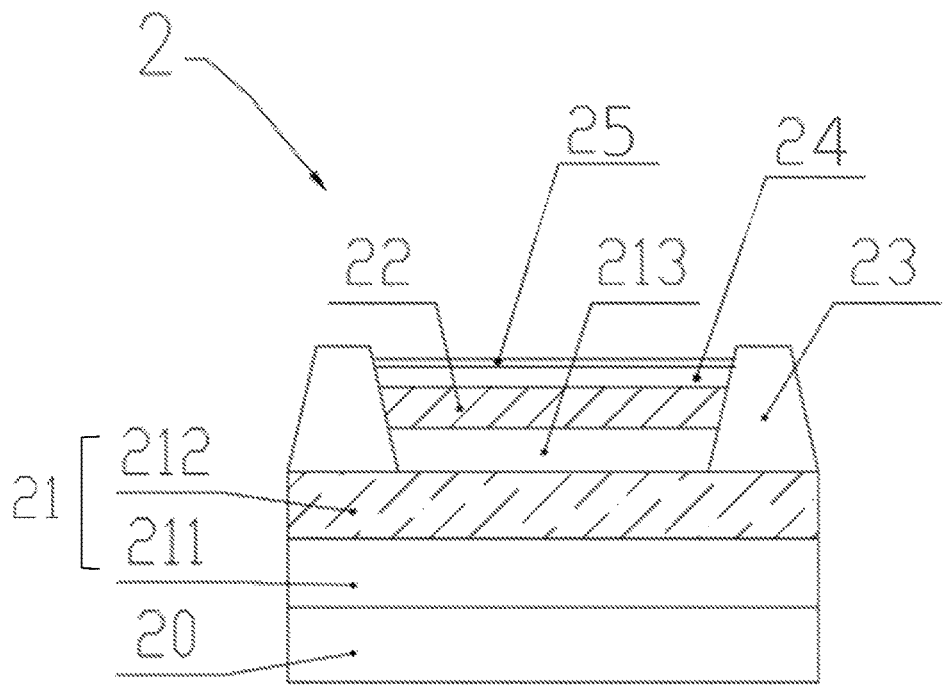
FIG. 2 is a schematic view of a structure of an OLED substrate according to an embodiment of the present disclosure.
Figure 3:
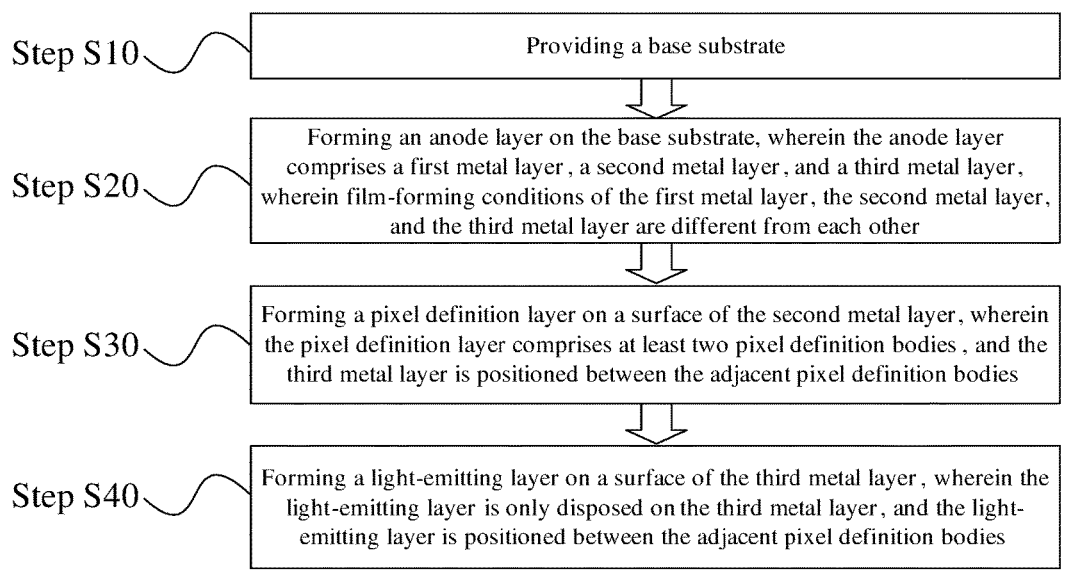
FIG. 3 is a flowchart of an OLED substrate manufacturing method according to an embodiment of the present disclosure.
Figure 4:
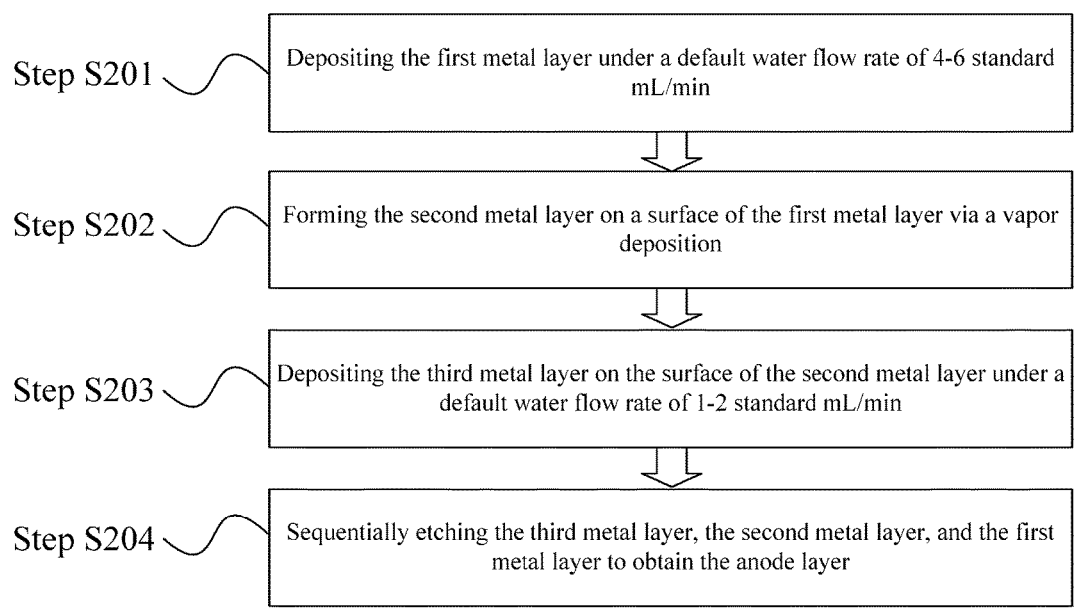
FIG. 4 is a flowchart of step S20 of an OLED substrate manufacturing method according to an embodiment of the present disclosure.

FIG. 2 is a schematic view of a structure of an OLED substrate according to an embodiment of the present disclosure; FIG. 3 and FIG. 4 are flowcharts of an OLED substrate manufacturing method according to embodiments of the present disclosure. The present disclosure provides a manufacturing method of an OLED substrate, the manufacturing method comprising:

a step S10 of providing a base substrate 20;

a step S20 of forming an anode layer 21 on the base substrate 20, wherein the anode layer 21 comprises a first metal layer 211, a second metal layer 212, and a third metal layer 213 stacked in sequence;

in the step S10, a thin film transistor substrate is provided as the substrate 20, the thin film transistor substrate comprises a plurality of thin film transistors distributed in an array.

The step S20 of forming the anode layer on the base substrate 21 comprises:

a step S201 of depositing the first metal layer under a default cooling water flow rate condition of 4-6 standard mL/min;

wherein the first metal layer 211 is a bottom metal layer of the anode layer 21 and is arranged on the surface of the base substrate 20, the first metal layer 211 is usually an ITO thin film, the ITO thin film is a semi-transparent conductive film which made of indium tin oxide, and has a good electrical conductivity.

The first metal layer 211 performs film-forming process via a physical vapor deposition technique, and the film-forming condition of the first metal layer 211 is: in a vacuum state, a default cooling water flow rate is 4-6 standard mL/min;

a step S202 of forming the second metal layer 212 on a surface of the first metal layer 211 via vapor deposition.

The second metal layer 212 is mostly a silver metal layer, which has good conductivity. The second metal layer 212 is an emission layer of the anode layer 21 structure, which should not be directly contacted with the organic light-emitting materials, otherwise, the light-emitting performance of the OLED substrate 2 will be affected.

A step S203 of depositing the third metal layer 213 on the surface of the second metal layer 212 under a default cooling water flow rate condition of 1-2 standard mL/min;

wherein the third metal layer 213 and the first metal layer 211 are made of the same material, and the structures thereof are basically the same.

The third metal layer 213 is formed via a physical vapor deposition technique. In a vacuum state, a default water flow rate is 1-2 standard mL/min; compared with the film-forming conditions of the first metal layer 211, the film-forming conditions of the third metal layer 213 have a cooling water flow rate far less than the cooling water flow rate of the first metal layer 211 during film forming process thereof;

A step S204 of sequentially etching the third metal layer 213, the second metal layer 212, and the first metal layer 211 to obtain the anode layer 21.

Due to the same materials and structures of the third metal layer 213 and the first metal layer 211, the third metal layer 213, which is disposed on the first metal layer, is also etched by the etching solution again when the first metal layer is substantially etched after the etching of the third metal layer 213. However, the etching speed of the third metal layer 213 can be slowed down because of the small amount of crystallization on the surface of the third metal layer 213, so that the loss caused by the repeated etching of the third metal layer 213 is reduced, and structural integrity of the anode layer 21 is thus ensured.

The etching process of the first metal layer 211, the second metal layer 212, and the third metal layer 213 is a wet etching process.

A step S30 of forming a pixel definition layer 23 on a surface of the second metal layer 212, the pixel definition layer 23 comprises at least two pixel definition bodies, and the third metal layer 213 is positioned between the adjacent pixel definition bodies;

wherein the pixel definition layer is made of polyimide.

A step S40 of forming a light-emitting layer 22 on a surface of the third metal layer 213, wherein the light-emitting layer 22 is only disposed on the third metal layer 213, and the light-emitting layer 22 is positioned between the adjacent pixel definition bodies;

wherein, the light-emitting layer 22 is a light-emitting part of the OLED substrate 2.

According to the above objects, the present disclosure further provides a manufacturing method of an OLED display device, the manufacturing method of the OLED display device comprises:

a step S10 of providing a base substrate;

a step S20 of forming an anode layer on the base substrate, wherein the anode layer comprises a first metal layer, a second metal layer, and a third metal layer stacked in sequence;

a step S30 of forming a pixel definition layer on a surface of the second metal layer, wherein the pixel definition layer comprises at least two pixel definition bodies, and the third metal layer is positioned between the adjacent pixel definition bodies;

a step S40 of forming a light-emitting layer on a surface of the third metal layer, wherein the light-emitting layer is only disposed on the third metal layer, and the light-emitting layer is positioned between the adjacent pixel definition bodies;

a step S50 of coating a cathode on a surface of the light-emitting layer; and a step S60 of forming an encapsulation thin film layer on the surface of the cathode;

wherein film-forming conditions of the first metal layer, the second metal layer, and the third metal layer are different from each other.

The step S20 of forming the anode layer on the base substrate comprises:

a step S201 of depositing the first metal layer under a default cooling water flow rate condition of 4-6 standard mL/min;

a step S202 of forming the second metal layer on a surface of the first metal layer via vapor deposition;

a step S203 of depositing the third metal layer on the surface of the second metal layer under a default cooling water flow rate condition of 1-2 standard mL/min; and a step S204 of sequentially etching the third metal layer, the second metal layer, and the first metal layer to obtain the anode layer.

The principle of the manufacturing method of the OLED display device in the embodiment is consistent with the principle of the manufacturing method of the OLED substrate in the embodiment, specific references can be made to the working principle of the manufacturing method of an OLED substrate according to the preferred embodiments, which is not repeated herein.

The present disclosure provides a manufacturing method of an OLED substrate and a manufacturing method of an OLED display device. By changing the film forming conditions of the first metal layer and the third metal layer in the anode, the etching loss of the third metal layer is reduced so that all of the vapor evaporated OLED organic light-emitting materials fall on the third metal layer, which greatly improves the light-emitting characteristics of OLEDs.

In summary, although the present disclosure has been described with preferred embodiments thereof, the above preferred embodiments are not used to limit the present disclosure. One of ordinarily skill in the art can carry out changes and modifications to the described embodiment without departing from the scope and the spirit of the disclosure that is intended to be limited only by the appended claims.

What is claimed is:

1. A manufacturing method of an organic light emitting diode (OLED) substrate, comprising:
   a step S10 of providing a base substrate;
   a step S20 of forming an anode layer on the base substrate, wherein the anode layer comprises a first metal layer, a second metal layer, and a third metal layer stacked in sequence;
   a step S30 of forming a pixel definition layer on a surface of the second metal layer, wherein the pixel definition layer is made of polyimide, the pixel definition layer comprises at least two pixel definition bodies, and the third metal layer is positioned between the adjacent pixel definition bodies; and
   a step S40 of forming a light-emitting layer on a surface of the third metal layer, wherein the light-emitting layer is only disposed on the third metal layer and does not touch the second metal layer, and the light-emitting layer is positioned between the adjacent pixel definition bodies;
   wherein default water flow rates of the first metal layer and the third metal layer are different from each other.

2. The manufacturing method of the OLED substrate according to claim 1, wherein the step S20 of forming the anode layer on the base substrate comprises:
   a step S201 of depositing the first metal layer under a default water flow rate of 4-6 standard mL/min;
   a step S202 of forming the second metal layer on a surface of the first metal layer via vapor deposition;
   a step S203 of depositing the third metal layer on the surface of the second metal layer under a default water flow rate of 1-2 standard mL/min; and
   a step S204 of sequentially etching the third metal layer, the second metal layer, and the first metal layer to obtain the anode layer.

3. The manufacturing method of the OLED substrate according to claim 2, wherein the first metal layer and the third metal layer are indium tin oxide (ITO), and the second metal layer is silver.

4. The manufacturing method of the OLED substrate according to claim 2, wherein the third metal layer, the second metal layer, and the first metal layer are sequentially etched by wet etching.

5. The manufacturing method of the OLED substrate according to claim 2, wherein a physical vapor deposition is employed to perform film-forming processes on the first metal layer and the third metal layer.

6. A manufacturing method of an organic light emitting diode (OLED) display device, comprising:
   a step S10 of providing a base substrate;
   a step S20 of forming an anode layer on the base substrate, wherein the anode layer comprises a first metal layer, a second metal layer, and a third metal layer stacked in sequence;
   a step S30 of forming a pixel definition layer on a surface of the second metal layer, wherein the pixel definition layer comprises at least two pixel definition bodies, and the third metal layer is positioned between the adjacent pixel definition bodies;
   a step S40 of forming a light-emitting layer on a surface of the third metal layer, wherein the light-emitting layer is only disposed on the third metal layer and does not touch the second metal layer, and the light-emitting layer is positioned between the adjacent pixel definition bodies;
   a step S50 of coating a cathode on a surface of the light-emitting layer; and
   a step S60 of forming an encapsulation thin film layer on the surface of the cathode;
   wherein default water flow rates of the first metal layer and the third metal layer are different from each other.

7. The manufacturing method of the OLED display device according to claim 6, wherein the step S20 of forming the anode layer on the base substrate comprises:
   a step S201 of depositing the first metal layer under a default water flow rate of 4-6 standard mL/min;
   a step S202 of forming the second metal layer on a surface of the first metal layer via vapor deposition;
   a step S203 of depositing the third metal layer on the surface of the second metal layer under a default water flow rate of 1-2 standard mL/min; and
   a step S204 of sequentially etching the third metal layer, the second metal layer, and the first metal layer to obtain the anode layer.

8. The manufacturing method of the OLED display device according to claim 7, wherein the first metal layer and the third metal layer are indium tin oxide (ITO), and the second metal layer is silver.

9. The manufacturing method of the OLED display device according to claim 7, wherein a physical vapor deposition is employed to perform film-forming processes on the first metal layer and the third metal layer.

10. A manufacturing method of an organic light emitting diode (OLED) substrate, comprising:
    a step S10 of providing a base substrate;
    a step S20 of forming an anode layer on the base substrate, wherein the anode layer comprises a first metal layer, a second metal layer, and a third metal layer stacked in sequence;
    a step S30 of forming a pixel definition layer on a surface of the second metal layer, wherein the pixel definition layer comprises at least two pixel definition bodies, and the third metal layer is positioned between the adjacent pixel definition bodies; and
    a step S40 of forming a light-emitting layer on a surface of the third metal layer, wherein the light-emitting layer is only disposed on the third metal layer and does not touch the second metal layer, and the light-emitting layer is positioned between the adjacent pixel definition bodies;
    wherein default water flow rates of the first metal layer and the third metal layer are different from each other.

11. The manufacturing method of the OLED substrate according to claim 10, wherein the step S20 of forming the anode layer on the base substrate comprising:
    a step S201 of depositing the first metal layer under a default water flow rate of 4-6 standard mL/min;

a step S202 of forming the second metal layer on a surface of the first metal layer via vapor deposition;

a step S203 of depositing the third metal layer on the surface of the second metal layer under a default water flow rate of 1-2 standard mL/min; and a step S204 of sequentially etching the third metal layer, the second metal layer and the first metal layer to obtain the anode layer.

12. The manufacturing method of the OLED substrate according to claim 11, wherein the first metal layer and the third metal layer are indium tin oxide (ITO), and the second metal layer is silver.

13. The manufacturing method of the OLED substrate according to claim 11, wherein the third metal layer, the second metal layer and the first metal layer are sequentially etched by wet etching.

14. The manufacturing method of the OLED substrate according to claim 11, wherein a physical vapor deposition is employed to perform film-forming processes on the first metal layer and the third metal layer.

\* \* \* \* \*